United States Patent
Belopolsky

(12) 
(10) Patent No.: US 6,422,901 B1
(45) Date of Patent: Jul. 23, 2002

(54) SURFACE MOUNT DEVICE AND USE THEREOF

(75) Inventor: Yakov Belopolsky, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/455,199

(22) Filed: Dec. 6, 1999

(51) Int. Cl.[7] ............................................. H01R 13/66
(52) U.S. Cl. ........................................ 439/620; 439/83
(58) Field of Search ........................ 439/620, 83, 941

(56) References Cited

U.S. PATENT DOCUMENTS

| | | | |
|---|---|---|---|
| 3,880,493 A | * 4/1975 | Lockhart, Jr. ............... | 439/620 |
| 4,379,606 A | 4/1983 | Clark et al. ................. | 439/490 |
| 4,386,818 A | 6/1983 | Millhimes et al. .......... | 439/585 |
| 4,704,320 A | 11/1987 | Mizunoya et al. .......... | 428/210 |
| 4,791,391 A | * 12/1988 | Linnell et al. .............. | 333/184 |
| 4,801,904 A | * 1/1989 | Sakamoto et al. .......... | 333/182 |
| 4,801,912 A | 1/1989 | McElheny et al. ......... | 336/84 M |
| 4,978,317 A | 12/1990 | Pocrass ....................... | 439/490 |
| 5,147,224 A | 9/1992 | Tan et al. .................... | 439/620 |
| 5,151,054 A | * 9/1992 | Briones et al. .............. | 439/620 |
| 5,213,522 A | 5/1993 | Kojima ....................... | 439/620 |
| 5,246,389 A | * 9/1993 | Briones ....................... | 439/620 |
| 5,306,949 A | 4/1994 | Yamada et al. ............. | 257/690 |
| 5,397,250 A | 3/1995 | Briones ....................... | 439/620 |
| 5,401,910 A | * 3/1995 | Mandai et al. .............. | 174/250 |
| 5,407,366 A | 4/1995 | Briones et al. ............. | 439/639 |
| 5,469,326 A | 11/1995 | Kanetake .................... | 361/534 |
| 5,554,050 A | * 9/1996 | Marpoe, Jr. ................. | 439/620 |
| 5,613,873 A | 3/1997 | Bell, Jr. ...................... | 439/490 |
| 5,616,955 A | 4/1997 | Yamada et al. ............. | 257/690 |
| 5,692,925 A | 12/1997 | Bogese, II .................. | 439/620 |
| 5,700,157 A | 12/1997 | Chung ......................... | 439/490 |
| 5,704,802 A | 1/1998 | Loudermilk ................ | 439/490 |
| 5,741,152 A | 4/1998 | Boutros ....................... | 439/490 |

FOREIGN PATENT DOCUMENTS

EP          0 817 323 A1     1/1998

* cited by examiner

*Primary Examiner*—Tulsidas Patel
(74) *Attorney, Agent, or Firm*—Woodcock Washburn LLP

(57) ABSTRACT

A surface mount device (SMD) has a plurality of electrodes and a generally planar contact surface for facing and at least partially contacting a substrate such as a conductive shield. At least one electrode is present at the contact surface and electrically contacts the substrate, and in at least one embodiment at least one electrode is absent from the contact surface and does not electrically contact the substrate. The shield may be part of an electrical device which has a lead electrically coupled to the at least one electrode absent from the contact surface.

17 Claims, 3 Drawing Sheets

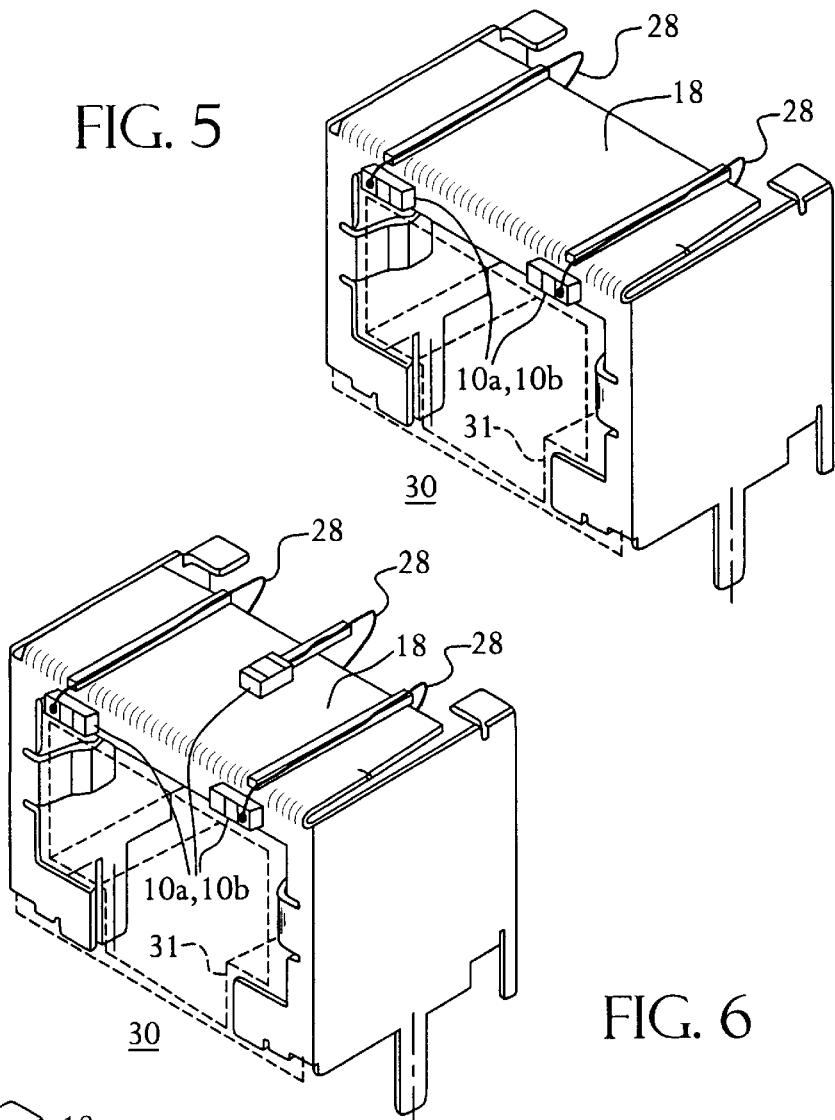
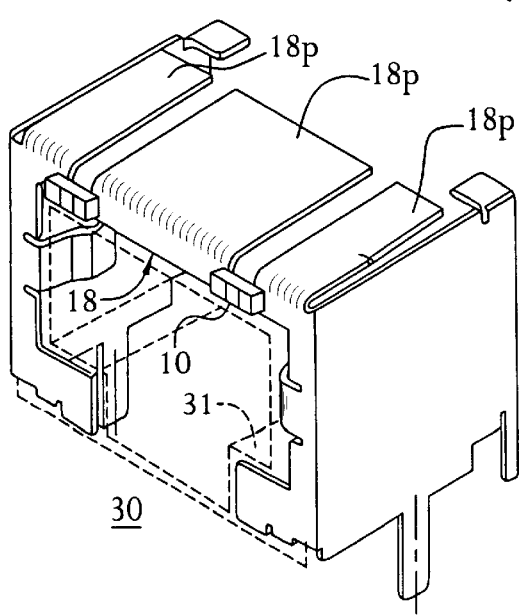

SURFACE MOUNT DEVICE AND USE THEREOF

FIELD OF THE INVENTION

The present invention relates to a surface mount device such as a resistor or diode, and to an electrical connector having such a surface mount device.

BACKGROUND OF THE INVENTION

As is known, a surface mount device (SMD) is an electrical device particularly useful in manufacturing circuit boards and the like. Such SMD may be a two-terminal device such as a resistor, a capacitor, an inductor, or a diode; a three-terminal device such as a transistor, a four-terminal device; etc.

In one preferred form of SMD, electrical leads do not extend therefrom. Instead, the SMD includes electrodes integral with the surface thereof. That is, such electrodes are positioned on a contact surface of the SMD such that the electrodes contact corresponding conductive pads on a substrate when the contact surface is brought into aligned contact with such substrate. Typically, a solder or the like is employed to securely bond the SMD to the substrate by way of the electrodes at the contact surface and the corresponding conductive pads and in doing so to maintain a good electrical connection between such electrodes and conductive pads.

As should be understood, then, the lack of electrical leads allows the aforementioned SMD to be relatively small as compared with a conventional circuit element having leads. Accordingly, the real estate used by such SMD on the underlying substrate (i.e., the circuit board) is also relatively small, with the net result being that more circuitry may be placed on the substrate in a smaller space if SMDs are employed as circuit elements.

In one typical two-terminal SMD 10, such as that shown in FIG. 1, the actual circuit device (i.e., a resistor, a capacitor, an inductor, a diode such as an LED, etc.) is encased within a generally rectilinear block 12, and each electrode 14 extends from a top side 12*t* to an end side 12*e* and then to a bottom side 12*b* of the block 12. As maybe appreciated, the portions of the electrodes 14 at the bottom side 12*b* of the block 12 define a contact surface 16 that faces and at least partially contacts a substrate 18, and such electrodes 14 at the contact surface 16 are positioned to align with corresponding conductive pads 20 on the substrate 18.

A protrusion 22 may extend from the top side 12*t* of the block 12 between the electrodes 14. Such protrusion 22 may for example contain the operative portion of an LED if in fact the SMD 10 is an LED. In addition, a mounting pad 24 may be present at the bottom side 12*b* of the block 12 between the electrodes 14. Such mounting pad 24 forms a portion of the contact surface 16 along with the portions of the electrodes 14 at the bottom side 12*b* of the block 12, and may assist in securely bonding the SMD 10 to the substrate 18.

The SMD 10 as shown in FIG. 1 is entirely appropriate for being mounted to the substrate 18 as shown, where the electrodes 14 at the contact surface 16 align with the corresponding conductive pads 20 on the substrate 18. However, the SMD 10 may not be appropriate for being mounted to other substrates. For example, it may be desirable to mount a SMD 10 containing an LED to a conductive substrate such as a shield of an electrical device, where the LED SMD 10 is coupled to the electrical device and is present on the conductive shield of such electrical device as a visual indicator of some function of the electrical device. However, mounting such LED SMD 10 to such shield by way of the contact surface 16 of such LED SMD 10 would of course produce the unwanted effect of shorting out the LED SMD 10.

Accordingly, a need exists for an SMD 10 that could be employed in a situation where the SMD 10 is not being mounted to a substrate 18 having conductive pads 20 that correspond to the electrodes 14 on the contact surface 16 of such SMD 10, and also in other similar situations.

SUMMARY OF THE INVENTION

In the present invention, the aforementioned need is satisfied by a surface mount device (SMD) having a plurality of electrodes and a generally planar contact surface for facing and at least partially contacting a substrate such as a conductive shield. At least one electrode is present at the contact surface and electrically contacts the substrate. In several embodiments of the present invention, at least one electrode is absent from the contact surface and does not electrically contact the substrate. In these embodiments of the present invention, the shield is part of an electrical device which has a lead electrically coupled to the at least one electrode absent from the contact surface. In another embodiment, the SMD includes all electrodes and is mounted to a split conductive shield.

BRIEF DESCRIPTION OF THE DRAWINGS

The foregoing summary, as well as the following detailed description of preferred embodiments of the present invention, will be better understood when read in conjunction with the appended drawings. For the purpose of illustrating the invention, there are shown in the drawings embodiments which are presently preferred. As should be understood, however, the invention is not limited to the precise arrangements and instrumentalities shown. In the drawings:

FIG. 5 is a top perspective view of an example of an electrical device which includes a conductive shield and the SMD of FIGS. 2 or 3;

FIG. 6 is a top perspective view of a variation of the example of FIG. 5; and

FIG. 7 is a top perspective view of a variation of the examples of FIGS. 5 and 6, where the shield of the electrical device is electrically separated into a number of portions and the SMD of FIG. 1 is employed to bridge adjacent portions.

DETAILED DESCRIPTION OF PREFERRED EMBODIMENTS

Figure 1:
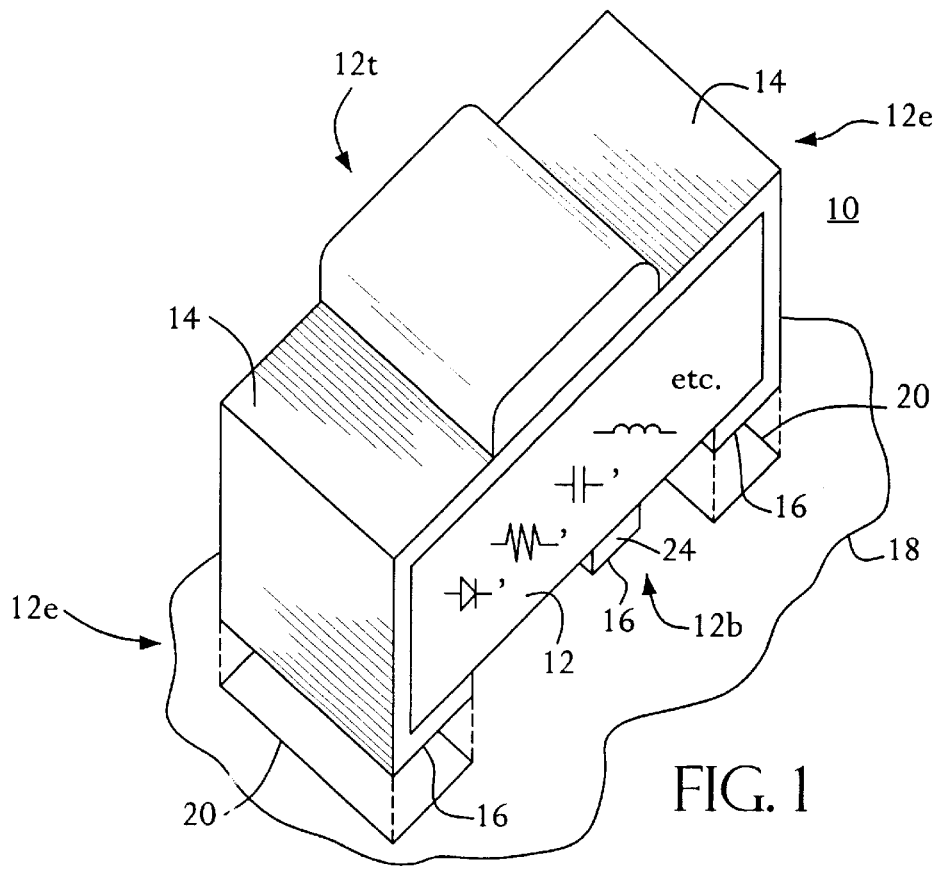
FIG. 1 is a top perspective view of a typical surface mount device (SMD)

Certain terminology may be used in the following description for convenience only and is not considered to be limiting. The words "left", "right", "upper", and "lower"

designate directions in the drawings to which reference is made. The words "inwardly" and "outwardly" are further directions toward and away from, respectively, the geometric center of the referenced object. The words "vertical" and "horizontal" in the present application designate orientations with respect to an object when such object is positioned in a particular and/or customary manner, but do not restrict the present invention to the object in such position. The terminology includes the words above specifically mentioned, derivatives thereof, and words of similar import.

Figure 2:
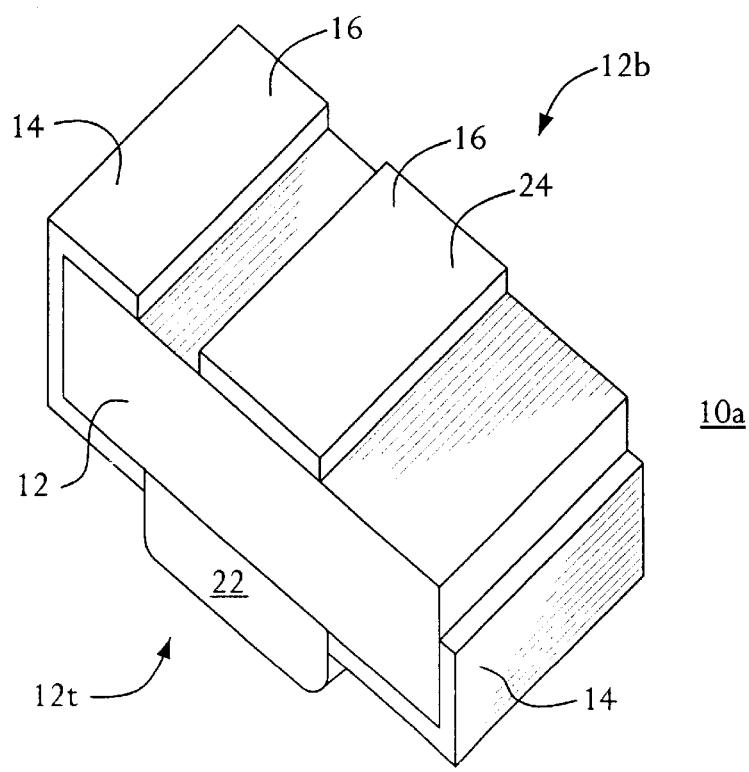
FIG. 2 is a bottom perspective view of an SMD similar to the SMD of FIG. 1, but in accordance with one embodiment of the present invention.

Referring now to the drawings, wherein like numerals are used to indicate like elements throughout, it is seen in FIG. 2 that an SMD 10a similar to the SMD 10 of FIG. 1 is shown. As shown, the SMD 10a and the SMD 10 share the common features of an actual circuit device (i.e., a resistor, a capacitor, an inductor, a diode such as an LED, etc.) encased within a generally rectilinear block 12, a protrusion 22 at the top side 12t of the block 12; and a mounting pad 24 at the bottom side 12b of the block 12. However, the SMD 10a may be other than a two-terminal device, the protrusion 22 may be omitted, and/or the mounting pad 24 may be omitted all without departing from the spirit and scope of the present invention as set forth below.

As also shown in FIG. 2, the SMD 10a and the SMD 10 differ in that one of the electrodes 14 of the SMD 10a does not extend to the bottom side 12b of the block 12. Accordingly, the contact surface 16 at the bottom side 12b of the block 12 of the SMD 10a does not include both electrodes 14 thereof. As a result, the SMD 10a is appropriate for being mounted to a conductive substrate 18 such as a conductive shield of an electrical device. In particular, such conductive shield 18 or the like would not short out the SMD 10a because only one electrode 14 of such SMD 10a is electrically contacting the shield 18. Of course, the SMD 10a of the present invention may also be mounted to other conductive and non-conductive substrates 18 without departing from the spirit and scope of the present invention.

The non-extending electrode 14 may be formed by any appropriate method without departing from the spirit and scope of the present invention. For example, the SMD 10a may be constructed or manufactured with the non-extending electrode. Alternatively, the SMD 10b may be constructed or manufactured by modifying an SMD substantially similar if not identical to the SMD 10 of FIG. 1, wherein the modification entails physically removing a portion of one of the electrodes 14 in the region of the bottom side 12b of the block 12. Such removal may be accomplished by any appropriate method without departing from the spirit and scope of the present invention. For example, the removal may be accomplished by prying, cutting, by grinding, by chemicals, and/or the like.

Figure 3:
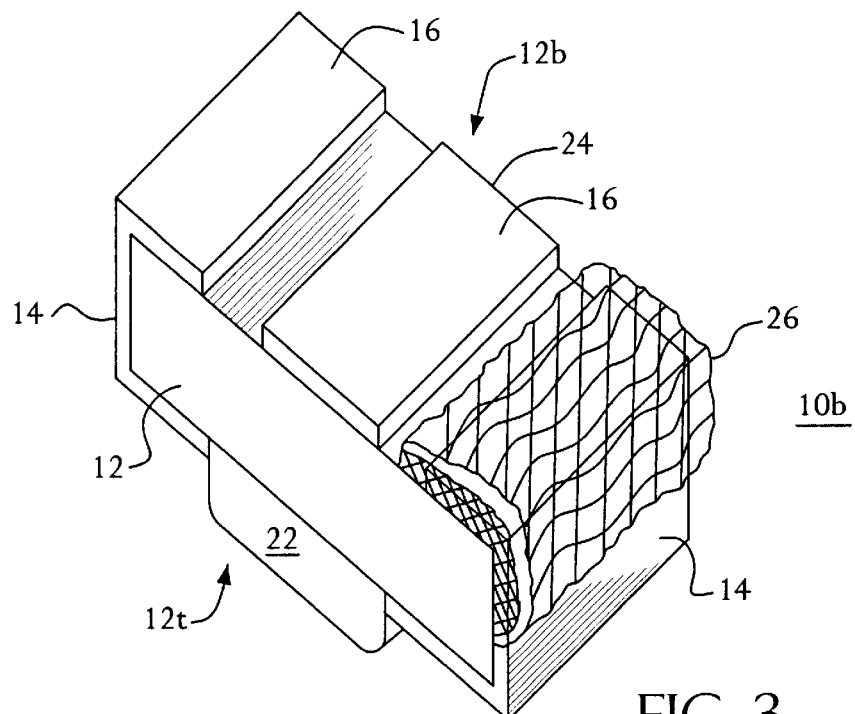
FIG. 3 is a bottom perspective view of an SMD similar to the SMD of FIG. 1, but in accordance with another embodiment of the present invention.

In a variation of the SMD 10a of FIG. 2, and referring now to FIG. 3, it is seen that an SMD 10b similar to the SMD 10 of FIG. 1 is shown. As shown, the SMD 10b is substantially similar if not identical to the SMD 10 of FIG. 1, except that one of the electrodes 14 of the SMD 10b is covered with an insulative covering 26 in the region of the bottom side 12b of the block 12. Accordingly, and again, the contact surface 16 at the bottom side 12b of the block 12 of the SMD 10b does not include both electrodes 14 thereof As a result, the SMD 10b is appropriate for being mounted to a substrate 18 in the same manner as the SMD 10a. Again, the SMD 10b of the present invention may also be mounted to other conductive and non-conductive substrates 18 without departing from the spirit and scope of the present invention. Generally, substrate 18 should have at least a metallized surface such as for example $Al_2O_3$, $BaTiO_2$, or porcelain on steel. Preferably, substrate 18 is a conductive shield of an electrical device.

The insulative covering 26 may be any appropriate insulative covering without departing from the spirit and scope of the present invention. For example, the insulative covering 26 may be epoxy, a solder mask, or "KAPTON" pressure-sensitive tape or the like. As may be appreciated, such insulative covering 26 may be added to the SMD 10 of FIG. 1 to form the SMD 10b of FIG. 3, or the SMD 10b of FIG. 3 may be formed with the insulative covering 26 in another manner without departing from the spirit and scope of the present invention. As with the SMD 10a, the SMD 10b may be other than a two-terminal device, the protrusion 22 of the SMD 10b may be omitted, and/or the mounting pad 24 of the SMD 10b may be omitted all without departing from the spirit and scope of the present invention.

In the present invention, then, an SMD 10a, 10b has a plurality of electrodes 14 and a plurality of surfaces including a generally planar contact surface 16 for facing and at least partially contacting a substrate 18. At least one electrode 14 of the SMD 10a, 10b is present at the contact surface 16 for electrically contacting the substrate 18. That is, such 'present' electrode 14 electrically contacts the substrate 18 when the SMD 10a, 10b is contacted to the substrate 18 by way of such contact surface 16. Importantly, at least one electrode 14 is absent from the contact surface 16 for not electrically contacting the substrate 18. That is, such 'absent' electrode 14 does not electrically contact the substrate 18 when the SMD 10a, 10b is contacted to the substrate 18 by way of such contact surface 16.

As should now be apparent, the absent electrode 14 may be an electrode 14 that does not appear at the contact surface 16, such as for example the absent electrode 14 of the SMD 10a of FIG. 2 which does not extend to the bottom side 12b of the block 12. Alternatively, the absent electrode 14 may be an electrode 14 that appears adjacent the contact surface 16 and is insulatively covered at such contact surface 16, such as for example the absent electrode 14 of the SMD 10b of FIG. 3.

Figure 4:
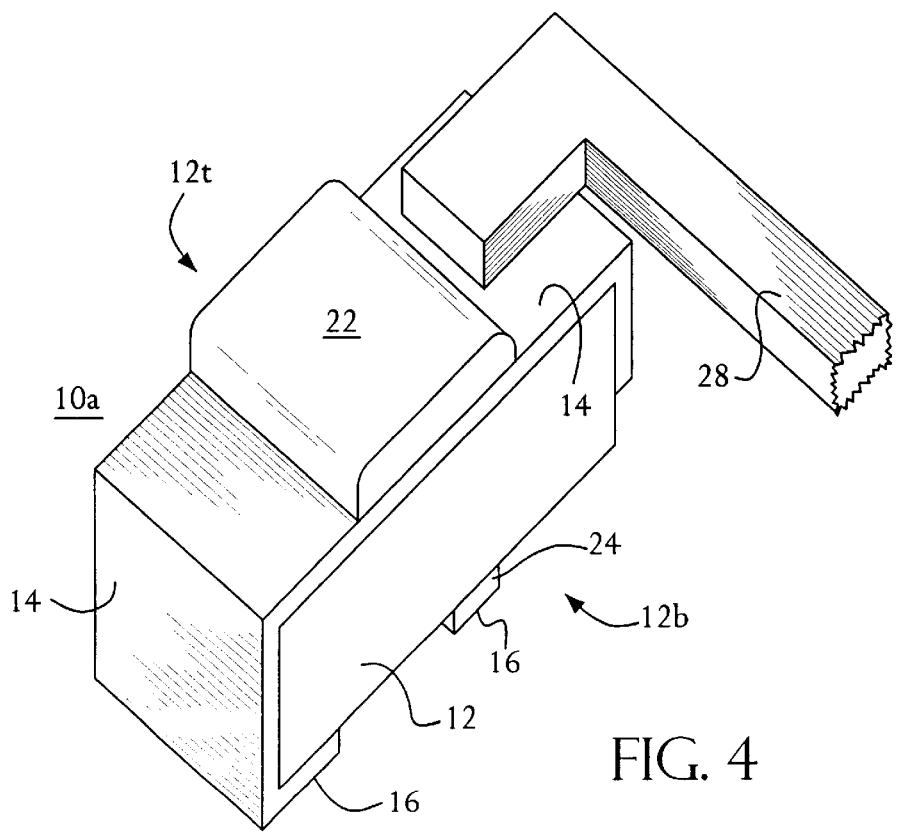
FIG. 4 is a top perspective view of the SMD of FIG. 2, and shows a lead extending from the electrode absent from the contact surface of the SMD.

Of course, with the absent electrode 14 not contacting any underlying substrate 18, provision must be made for electrically coupling such absent electrode to complete a circuit containing the SMD 10a, 10b. In one embodiment of the present invention, and referring now to FIG. 4, such circuit is completed by way of a lead 28 electrically coupled to and extending from the absent electrode 14. As shown, the lead 28 may be formed by a conductive strip of material such as a copper alloy or the like, and may be electrically coupled to the absent electrode 14 by way of solder, a weld, or the like. Of course, other materials and other methods of coupling may be employed without departing from the spirit and scope of the present invention. Moreover, other types of leads 28, such as wire or a flex circuit, may also be employed without departing from the spirit and scope of the present invention. If the substrate 18 is a conductive shield of an electrical device, the lead 28 may extend to such electrical device. Accordingly, the SMD 10a, 10b is coupled by the lead 28 and the shield substrate 18 to the electrical device and performs some function in connection with such electrical device.

Referring now to FIG. 5, an example of the aforementioned electrical device is shown and referenced as element number 30. As may be appreciated, electrical device 30 is a connector such as an RJ-type connector for receiving an RJ-type plug (with the conventional internal portions of the connector 30 omitted from the drawings for the sake of clarity), although such device 30 may also be any other appropriate device without departing from the spirit and scope of the present invention. Here, the connector 30 includes the aforementioned shield/substrate 18, and a pair of SMDs 10a, 10b are mounted to and contact the shield 18 such that the present electrode 14 of each SMD 10a, 10b electrically contacts the shield 18. In addition, a lead 28 extends from the connector 30 to the absent electrode 14 of each SMD 10a, 10b. Shield 18 typically surrounds a connector housing 31 within which the leads 28 originate.

In one embodiment of the present invention, each SMD 10a, 10b shown in FIG. 5 is or includes an LED or the like which is lit by the connector 30 or a device coupled thereto upon the occurrence of a pre-defined event. As should be appreciated, such lighting takes place by way of an appropriate signal across the lead 28 and the shield 18. Thus, each LED SMD 10a, 10b may be placed anywhere on the shield 18, and requires only a single lead 28 for control thereof. The pre-defined event may be any event without departing from the spirit and scope of the present invention. For example, such event could be a signal transmission, successful mating with a connector, etc.

FIG. 6 shows a variation of the example of FIG. 5, wherein three SMDs 10a, 10b are employed in the connector 30. Here, the two SMDs 10a, 10b at the front face of the connector are LEDs, the one SMD 10a, 10b on the top face of the connector is a limiting resistor, and the shield 18 acts as a common connection between all three SMDs 10a, 10b. Thus, to light the left LED SMD 10a, 10b, an appropriate signal is placed across the leads 28 for the left LED and top resistor SMDs 10a, 10b. Likewise, to light the right LED SMD 10a, 10b, an appropriate signal is placed across the leads 28 for the right LED and top resistor SMDs 10a, 10b.

In FIGS. 5 and 6, a shield 18 of an electrical device 30 is employed as part of a signal path. In a variation thereon, and referring now to FIG. 7, the shield 18 includes a plurality of portions 18p such as the first, second, and third portions 18p shown, and each portion 18p is electrically separate from one another. An SMD 10 (i.e., an SMD with a pair of present electrodes) may be placed to bridge adjacent portions 18p, and a signal may be placed across each SMD 10 by way of the portions 18p of the shield 18 contacted by such SMD 10.

In this embodiment, both electrodes of each SMD 10 remain at contact surface 16 to engage respective shield portions 18p. In particular, and as shown, a first electrode 14 of a first SMD 10 electrically contacts the first portion 18p of the shield 18, a second electrode 14 of the first SMD 10 electrically contacts a second portion 18p of the shield 18, a first electrode 14 of a second SMD 10 electrically contacts the second portion 18p of the shield 18, and a second electrode 14 of the second SMD 10 electrically contacts the third portion 18p of the shield 18. Thus, the electrical device/connector 30 can place a first signal across the first SMD 10 by way of the first and second portions 18p of the shield 18, and the electrical device/connector 30 can further place a second signal across the second SMD 10 by way of the second and third portions 18p of the shield 18. Of course, the shield 18 may be divided into greater or lesser numbers of portions 18p without departing from the spirit and scope of the present invention.

Aside from the inventive features disclosed herein, SMDs such as the SMD 10 are known to the relevant public. Accordingly, a discussion of the construction of such SMDs, the materials used in such SMDs, the design specifications of such SMDs, the placement of such SMDs on a substrate, and the like is not deemed to be necessary herein.

Importantly, any type of SMDs may be employed without departing from the spirit and scope of the present invention, subject only to the limitations imposed by the appended claims.

As should now be understood, in the present invention, an SMD 10 is provided that can be employed in a situation where, for example, the SMD 10 is being mounted to a conductive shield substrate 18. Changes could be made to the embodiments described above without departing from the broad inventive concepts thereof. It is understood, therefore, that this invention is not limited to the particular embodiments disclosed, but it is intended to cover modifications within the spirit and scope of the present invention as defined by the appended claims.

What is claimed is:

1. A surface mount device having a plurality of electrodes and a plurality of surfaces including a generally planar contact surface for facing and at least partially contacting a substrate, the contact surface having a plurality of electrode locations, at least one electrode being positioned on an electrode location of the contact surface for electrically contacting the substrate, and at least one electrode being positioned on the surface of the device away from the contact surface for not electrically contacting the substrate, at least one electrode location on the contact surface not having an electrode thereon, wherein the at least one electrode away from the contact surface comprises an electrode that appears adjacent the contact surface and is covered with an insulative material at such contact surface.

2. The surface mount device of claim 1 having two electrodes.

3. The surface mount device of claim 2 comprising a member of a group consisting of a resistive device, a capacitive device, an inductive device, and a diode device.

4. The surface mount device of claim 1 further comprising a lead electrically coupled to and extending from the at least one electrode away from the contact surface.

5. The surface mount device of claim 1 in combination with the substrate, such substrate comprising a conductive material.

6. The surface mount device and substrate of claim 5 wherein the conductive material is a conductive shield of an electrical device, the electrical device including a lead electrically coupled to the at least one electrode away from the contact surface.

7. A method of manufacturing a surface mount device having a plurality of electrodes and a plurality of surfaces including a generally planar contact surface for facing and at least partially contacting a substrate, the method comprising fabricating the contact surface to have a plurality of electrode locations, fabricating at least one electrode to be positioned on an electrode location of the contact surface to electrically contact the substrate, and fabricating at least one electrode to be positioned on the surface of the device away from the contact surface to not electrically contact the substrate, at least one electrode location on the contact surface not having an electrode thereon by being insulatively covered at the contact surface.

8. The method of claim 7 further comprising electrically coupling a lead to the at least one away electrode such that the lead extends therefrom.

9. A method of electrically coupling a surface mount device to a substrate, the device having a plurality of electrodes and plurality of surfaces including a generally planar contact surface for facing and at least partially contacting the substrate, the contact surface having a plurality of electrode locations, the method comprising electrically contacting to the substrate at least one electrode present at an electrode location of the contact surface, and not electrically contacting to the substrate at least one electrode positioned on the surface of the device away from the contact surface, at least one electrode location on the contact surface thereby not having an electrode thereon, the at least one electrode positioned on the surface of the device away from the contact surface appearing adjacent the contact surface and being insulatively covered at such contact surface.

10. The method of claim 9 further comprising electrically coupling a lead to the at least one not electrically contacted electrode such that the lead extends therefrom.

11. The method of claim 9 wherein the substrate comprises a conductive shield of an electrical device, the method comprising electrically coupling a lead from the electrical device to the at least one not electrically contacted electrode.

12. An electrical device having a conductive shield and a surface mount device contacting the shield, the surface mount device having a plurality of electrodes and a plurality of surfaces including a generally planar contact surface for facing and at least partially contacting the shield, the contact surface having a plurality of electrode locations at which the electrodes may reside, at least one electrode being present at an electrode location of the contact surface and electrically contacting the shield, and at least one electrode being positioned away from the contact surface and not electrically contacting the shield at least one electrode location on the contact surface not having an electrode thereon, the electrical device further having a lead electrically coupled to the at least one electrode away from the contact surface, the at least one electrode away from the contact surface comprising an electrode that appears adjacent the contact surface and is insulatively covered at such contact surface.

13. The electrical device of claim 12 wherein the surface mount device has two electrodes.

14. The electrical device of claim 13 wherein the surface mount device comprises a member of a group consisting of a resistive device, a capacitive device, an inductive device, and a diode device.

15. An electrical device having a conductive shield and a surface mount device, the shield including first and second portions electrically separate from one another, the surface mount device having a first electrode electrically contacting the first portion of the shield and a second electrode electrically contacting the second portion of the shield, wherein the electrical device can place a signal across the surface mount device by way of the first and second portions of the shield.

16. The electrical device of claim 15 having first and second surface mount devices, wherein the shield includes first, second, and third portions electrically separate from one another, each surface mount device having first and second electrodes, the first electrode of the first surface mount device electrically contacting the first portion of the shield, the second electrode of the first surface mount device electrically contacting the second portion of the shield, the first electrode of the second surface mount device electrically contacting the second portion of the shield, the second electrode of the second surface mount device electrically contacting the third portion of the shield, wherein the electrical device can place a first signal across the first surface mount device by way of the first and second portions of the shield, and wherein the electrical device can place a second signal across the second surface mount device by way of the second and third portions of the shield.

17. The electrical device of claim 15 wherein the surface mount device comprises a member of a group consisting of a resistive device, a capacitive device, an inductive device, and a diode device.

* * * * *